(12) United States Patent
Liu et al.

(10) Patent No.: US 7,535,058 B2
(45) Date of Patent: May 19, 2009

(54) LATERAL DMOS STRUCTURE

(75) Inventors: Xian-Feng Liu, Shanghai (CN); Chong Ren, Shanghai (CN); Hai-Tao Huang, Shanghai (CN)

(73) Assignee: BCD Semiconductor Manufacturing Limited, George Town, Grand Cayman (KY)

( * ) Notice: Subject to any disclaimer, the term of this patent is extended or adjusted under 35 U.S.C. 154(b) by 61 days.

(21) Appl. No.: 11/785,867

(22) Filed: Apr. 20, 2007

(65) Prior Publication Data

US 2007/0278569 A1 Dec. 6, 2007

(30) Foreign Application Priority Data

Apr. 24, 2006 (CN) .................. 2006 2 0114836

(51) Int. Cl.
*H01L 29/735* (2006.01)

(52) U.S. Cl. .............. 257/335; 257/336; 257/337; 257/343; 257/344

(58) Field of Classification Search .............. 257/336, 257/343, 344, 335, E29.256, E29.261
See application file for complete search history.

(56) References Cited

U.S. PATENT DOCUMENTS

| 5,242,841 | A | * | 9/1993 | Smayling et al. | 438/275 |
| 5,559,044 | A | * | 9/1996 | Williams et al. | 438/234 |
| 7,365,402 | B2 | * | 4/2008 | Ma | 257/408 |

* cited by examiner

*Primary Examiner*—Ngan Ngo
*Assistant Examiner*—Benjamin Tzu-Hung Liu
(74) *Attorney, Agent, or Firm*—Muncy, Geissler, Olds & Lowe, PLLC

(57) ABSTRACT

A lateral DMOS structure includes a light doped p-type region beneath and near the gate at the drain side. The electric field on the surface near the gate is reduced. Thus the electric field near the gate decreases, and the SOA (safe operating area) of the lateral DMOS device increases and long time reliability improves. Moreover, the lateral DMOS of the invention can be fabricated without increasing the manufacturing cost.

6 Claims, 6 Drawing Sheets

LATERAL DMOS STRUCTURE

FIELD OF THE INVENTION

The present invention relates to an electronic device and a semiconductor manufacturing process thereof and particularly to a lateral DMOS structure.

BACKGROUND OF THE INVENTION

In DMOS devices, especially the DMOS devices produced through a semiconductor manufacturing process, the size of SOA (Safe Operating Area) and device long time reliability are two important performance parameters. For a DMOS device, the high electric field near the gate results in high surface electron concentration caused by impact ionization. This phenomenon affects SOA size and device long time reliability.

Hence how to effectively reduce and control the amount of electric field near the gate directly affects SOA size and device long time reliability of the DMOS device.

SUMMARY OF THE INVENTION

The primary object of the present invention is to provide a novel lateral DMOS structure that can effectively reduce the electric field near the gate to increase SOA size and improve device long time reliability of DMOS devices.

In one aspect of the invention a light doped p-type region is formed beneath and near the gate at the drain side.

In another aspect of the invention the surface electric field near the gate is reduced, and the surface electron impact ionization rate near the gate is reduced to $\frac{1}{6}$ of the region where not light doped p-type region is formed.

The lateral DMOS structure according to the invention has a source formed as follow: defining an N-layer on a P-substrate; forming an N-well on the N-layer; forming a P-body in the N-well; forming an N+ diffusion region on the P-body and forming a N-LDD structure at one side of the N+ diffusion region; forming a P+ diffusion region in the N+ diffusion region and forming the lateral DMOS source through a metal (M1) running through a contact hole.

The lateral DMOS has a drain formed as follow: defining an N-layer on the P-substrate; forming an N-well on the N-layer; forming an N+ diffusion region in the N-well; and forming the lateral DMOS drain through a metal (M1) running through a contact hole.

The lateral DMOS has a gate formed as follow: defining an N-layer on the P-substrate; forming an N-well on the N-layer; forming the DMOS gate in the N-well by wrapping a polysilicon layer with an isolation layer. The gate region covers the P-body of the DMOS source, and also covers the N+ diffusion region formed in the P-body and the N-LDD structure. The gate region also covers the N+ diffusion region of the DMOS drain. The light doped p-type region is formed in the N-well adjacent to the N+ diffusion region of the lateral DMOS drain.

Moreover, the lateral DMOS of the invention is spaced from other elements by adopting the following structure: defining a P-layer on the P-substrate; forming a P-well on the P-layer; and forming an isolation layer on the P-well.

According to one embodiment of the invention, a plurality of lateral DMOS are assembled to form a device. The device has an isolation structure at two sides. Two neighboring lateral DMOS structures share a common source. The source has an N-LDD structure at two sides of the N+ diffusion region. Or two neighboring lateral DMOS structures share a common drain. The drain has a light doped p-type region at two sides of the N+ diffusion region.

According to another embodiment of the invention, the light doped p-type region is formed by implanting boron ions.

By means of the invention the electric field near the gate can be effectively reduced to increase the SOA size and improve the device long time reliability of the DMOS devices.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
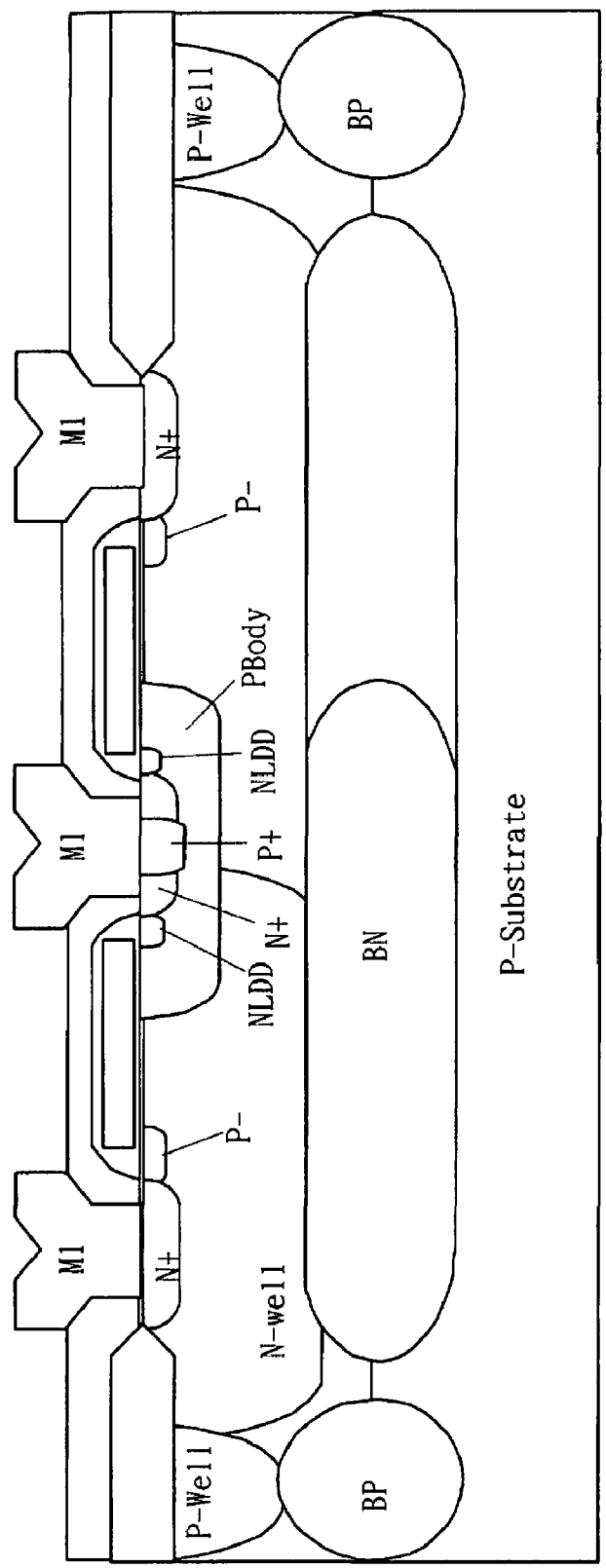
FIG. 1 is a cross section of an embodiment of the lateral DMOS structure of the invention.

The present invention aims to provide a lateral DMOS structure that has a light doped p-type region beneath and near the gate at the drain side. Refer to FIG. 1 for the cross section of an embodiment of the invention. It shows that a light doped p-type region (P−) is formed beneath and near the gate at the drain side.

Figure 2:
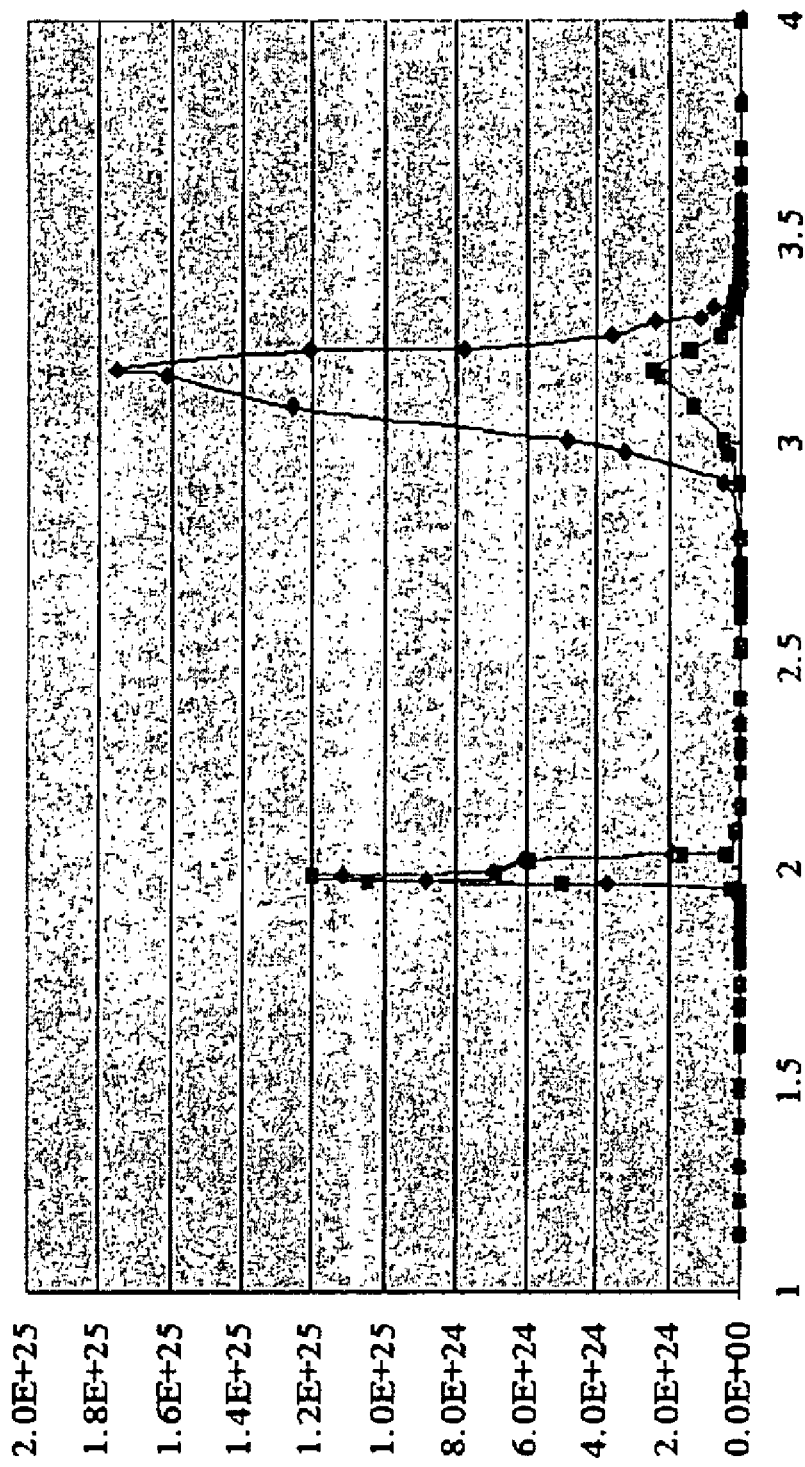
FIG. 2 is a chart showing the comparison of the impact ionization rate of the lateral DMOS of the invention on the surface near the gate in the condition of Vgs=8V, Vds=16V and a conventional DMOS near the gate.

Because of the existing of the light doped p-type region (P−), the electric field on the surface near the gate is reduced. Refer to FIG. 2 for the comparison of electron impact ionization rate of the lateral DMOS of the invention on the surface near the gate and a conventional DMOS near the gate. The line formed by linking the hollow dots illustrates the distribution of the electron impact ionization rate of the conventional structure. The region around 3 μm corresponds to the gate region. As indicated in the embodiment shown in FIG. 2, the electron impact ionization rate of the conventional DMOS on the surface near the gate is 1.8 E+25. When the lateral DMOS structure of the invention is adopted, the electron impact ionization rate on the surface near the gate is 3.0 E+24, and is about $\frac{1}{6}$ of the conventional structure. Thus the surface electron impact ionization as a result of the surface electric field can be reduced, thereby increase the SOA and improve the long time reliability of the lateral DMOS. Meanwhile the surface electric field at other areas does not change so that other performances of the lateral DMOS device can be coincided with the conventional lateral DMOS.

Referring to FIG. 1 again, according to the invention the lateral DMOS has a source formed as follow: defining an N-layer (BN) on a P-substrate; forming an N-well (N-well) on the N-layer; forming a P-body (Pbody) in the N-well; forming an N+ diffusion region (N+) in the P-body and forming an N-LDD structure (NLDD) at one side of the N+ diffusion region (N+); forming a P+ diffusion region (P+) in the N+ diffusion region (N+) and forming the lateral DMOS source through a metal (M1) running through a contact hole.

The lateral DMOS has the drain formed as follow: defining an N-layer (BN) on the P-substrate; forming an N-well (N-well) on the N-layer (BN); forming an N+ diffusion region (N+) in the N-well (N-well); and forming the lateral DMOS drain through a metal contact (M1) running through a contact hole in the N+ diffusion region (N+).

The lateral DMOS has the gate formed as follow: defining an N-layer (BN) on the P-substrate; forming an N-well (N-well) on the N-layer (BN); forming the DMOS gate in the N-well (N-well) by wrapping a poly-silicon layer (Poly) with an isolation layer. The gate region covers the P-body (Pbody) of the DMOS source, and also covers the N+ diffusion region (N+) formed in the P-body (Pbody) and the N-LDD structure (NLDD). The gate region also covers the DMOS N+ diffusion region (N+) of the DMOS drain. The light doped p-type region (P-) is formed in the N-well adjacent to the N+ diffusion region (N+) of the drain of the lateral DMOS.

The lateral DMOS is spaced from other elements by adopting the following structure: defining a P-layer (BP) on the P-substrate; forming a P-well (P-well) on the P-layer (BP); and forming an isolation layer on the P-well (P-well).

Also referring to FIG. 1, a plurality of the lateral DMOS structures of the invention may be assembled to form a device. The device has an isolation structure at two sides. Two neighboring lateral DMOS structures share a common source. In such a circumstance an N-LDD structure is formed at two sides of the N+ diffusion region of the source. The two neighboring lateral DMOS structures may also share a common drain. In such a circumstance a light doped p-type region is formed at two sides of the N+ diffusion region of the drain.

In the embodiment of the invention the light doped p-type region (P-) may be formed by implanting boron ions, or by implanting boron ions to form the P-LDD structure.

Figure 3:
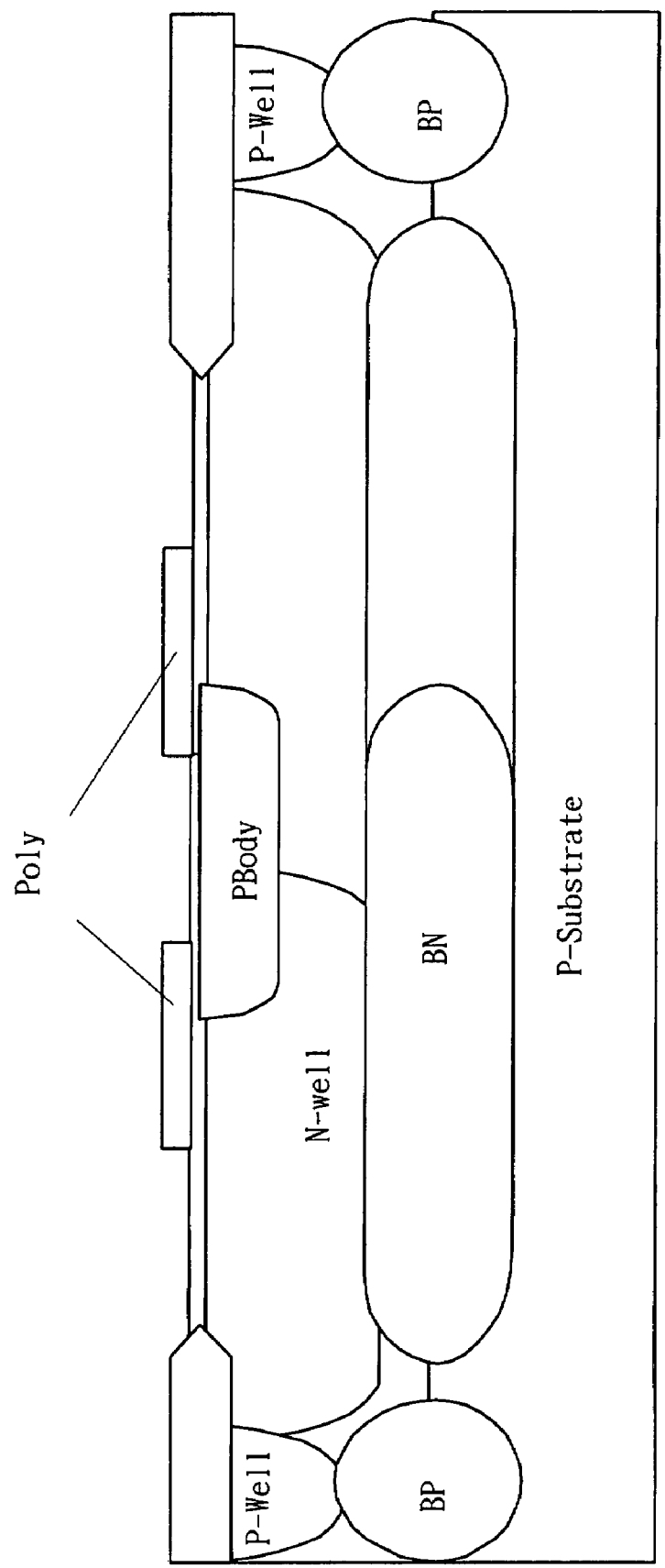
FIGS. 3 through 6 are schematic views of the processes for forming the lateral DMOS structure according to the invention.
Figure 4:
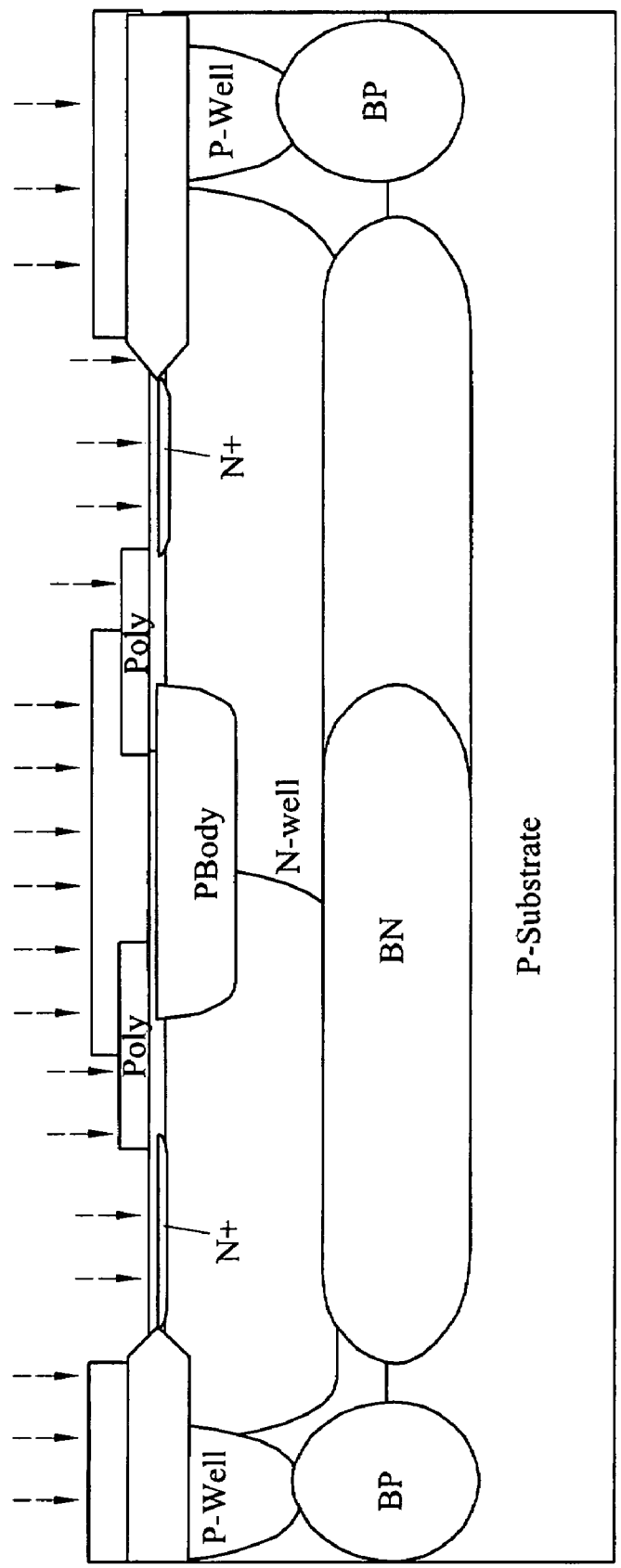
Figure 5:
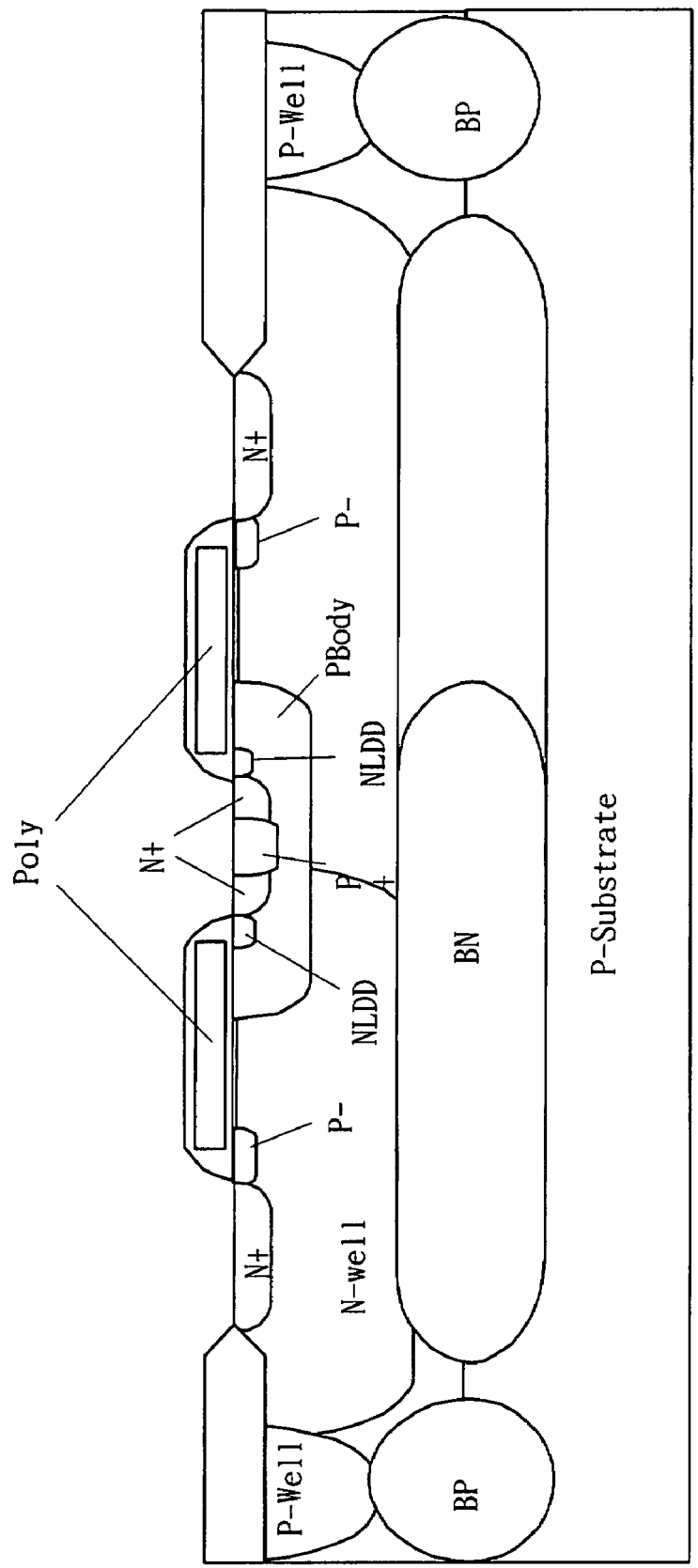

Refer to FIGS. 3 through 6 for the process flow for manufacturing the lateral DMOS structure of the invention. It includes the following steps:

First, form an N-layer (BN) on a selected region of a P-substrate where a desired device is to be fabricated; define a P-layer (BP) for isolating the periphery of the region; form an N-well (N-well) on the N-layer (BN) to fabricate the device; form a P-well (P-well) on the P layer (BP) to isolate the device; form a P-body (Pbody) in the N-well (N-well) where the source is to be formed; plant poly silicon (Poly) on a region where the gate is to be formed. The poly silicon and the P-body (Pbody) and N-well (N-well) are spaced and isolated through an oxide layer. The oxide layer may also be formed at other regions as required. Refer to FIG. 3 for the process steps previously discussed. FIGS. 3 through 5 illustrate an assembled device that is an embodiment with two neighboring lateral DMOS sharing a common source. A poly silicon (Poly) is formed respectively at two sides of the P-body (Pbody) to serve as the gate of the two lateral DMOS.

Afterward, referring to FIG. 4, oxidization and lithography etching processes are performed. These processes are known in the semiconductor manufacturing process, thus details are omitted. At this step the region corresponding to the drain of the lateral DMOS is implanted to form an N+ diffusion region (N+).

Referring to FIG. 5, an N+ diffusion region (N+) is formed on the P-body (Pbody) where the source is designated. In the N diffusion region (N+) a P+ diffusion region is formed, and an N-LDD structure (NLDD) also is formed at one side of the N+ diffusion region (N+). It is to be noted that the N-LDD Structure (NLDD) is adjacent to the N+ diffusion region (N+) and also located on the P-body. As the embodiment is an assembled device, namely two neighboring lateral DMOS share a common source, the N-LDD structure (NLDD) has to be formed respectively at two sides of the N+ diffusion region (N+). Moreover, a light doped p-type region (P-) also has to be formed at a region corresponding to the gate near the N+ diffusion region (N+) where the drain is to be formed. According to the embodiment of the invention, the light doped p-type region (P-) may be formed by implanting boron ions, or implanting boron ions to form the P-LDD structure.

Referring to FIG. 5, the gate of the lateral DMOS is formed by wrapping the poly silicon layer (Poly) with an isolation layer. The gate region also covers the P-body (Pbody) of the source of the DMOS and the N+ diffusion region (N+) and N-LDD structure (NLLD) formed in the P-body (Pbody). The gate region also covers the N+ diffusion region. (N+) of the drain of the DMOS. The light doped p-type region (P-) is formed in the N-well (N-well) adjacent to the N+ diffusion region (N+) of the drain of the lateral DMOS.

Figure 6:
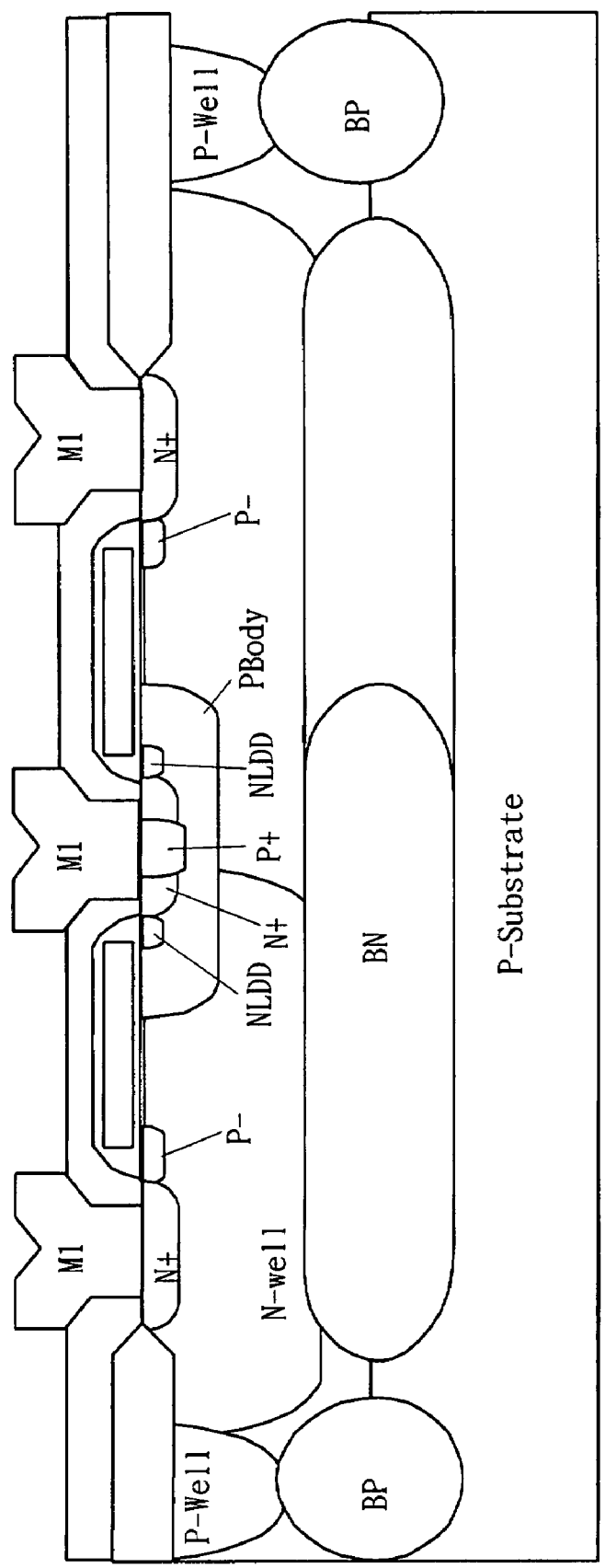

Finally, referring to FIG. 6, processes of forming through holes, implanting metal, lithography etching, oxidization, and laying of isolation layers are performed to form a pair of the DMOS devices. The two DMOS devices share a common source. The source and drain are exposed by running through a metal contact (M1) through the contact holes. The process steps depicted in FIG. 6 is similar to the conventional semiconductor manufacturing process, thus details are omitted.

Adopted the present invention the electric field near the gate can be effectively reduced to increase SOA size and improve long time reliability of the DMOS device. Moreover, the manufacturing process of the invention is similar to the conventional process for manufacturing CMOS or DMOS. Only the process of forming a light doped p-type region (P-) is added that can be accomplished by implanting boron ions, or implanting boron ions to form the P-LDD structure (both are techniques known in the art). Thus the lateral DMOS structure of the invention can be fabricated without increasing the manufacturing cost.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

The invention claimed is:

1. A lateral DMOS structure comprising a light doped p-type region beneath and near a gate at one side of a drain, the surface electric field near the gate being reduced, wherein lateral DMOS has a source which is formed as follow:
   defining an N-layer on a P-substrate;
   forming an N-well on the N-layer;
   forming a P-body in the N-well;
   forming an N+ diffusion region on the P-body and forming an N-LDD structure at one side of the N+ diffusion region; and
   forming a P+ diffusion region in the N+ diffusion region and forming the lateral DMOS source through a metal contact running through a contact hole;
   wherein the drain of the lateral DMOS is formed as follow:
   defining an N-layer on the P-substrate;
   forming an N-well on the N-layer;
   forming an N+ diffusion region in the N-well; and
   forming the lateral DMOS drain through a metal contact running through a contact hole in the N+ diffusion region; and
   wherein the gate of the lateral DMOS is formed as follow:
   defining an N-layer on the P-substrate;
   forming an N-well on the N-layer;
   forming the DMOS gate in the N-well through a poly-silicon layer wrapped by an isolation layer;
   wherein the gate region covers the P-body of the DMOS source and also covers the N+ diffusion region formed in the P-body and the N-LDD structure; and the gate region also covers the N+ diffusion region of the DMOS drain; the light doped p-type region is formed in the N-well adjacent to the N+ diffusion region of the drain of the lateral DMOS.

2. The lateral DMOS structure of claim 1, wherein electron impact ionization rate on the surface near the gate is reduced to ⅙ of the region where not light doped p-type region is formed.

3. The lateral DMOS structure of claim 1, wherein the lateral DMOS is spaced from other devices by adopting the following:
- defining a P-layer on the P-substrate;
- forming a P-well on the P-layer; and
- forming an isolation layer on the P-well.

4. The lateral DMOS structure of claim 3, wherein a plurality of the lateral DMOS are assembled to form a selected device which has an isolation structure at each of two sides thereof, wherein:
- two neighboring lateral DMOS structures share a common source which forms an N-LDD structure at two sides of the N+ diffusion region thereof.

5. The lateral DMOS structure of claim 3, wherein a plurality of the lateral DMOS are assembled to form a selected device which has an isolation structure at each of two sides thereof, wherein:
- two neighboring lateral DMOS structures share a common drain which forms a light doped p-type region at two sides of the N+ diffusion region thereof.

6. The lateral DMOS structure of claim 1, wherein the light doped p-type region is formed by implanting boron ions.

* * * * *